(12) United States Patent
Katsuma

(10) Patent No.: US 11,992,883 B2
(45) Date of Patent: May 28, 2024

(54) COATED TOOL AND CUTTING TOOL

(71) Applicant: KYOCERA CORPORATION, Kyoto (JP)

(72) Inventor: Tadashi Katsuma, Satsumasendai (JP)

(73) Assignee: KYOCERA Corporation, Kyoto (JP)

( * ) Notice: Subject to any disclaimer, the term of this patent is extended or adjusted under 35 U.S.C. 154(b) by 659 days.

(21) Appl. No.: 17/273,736

(22) PCT Filed: Sep. 3, 2019

(86) PCT No.: PCT/JP2019/034595
§ 371 (c)(1),
(2) Date: Mar. 5, 2021

(87) PCT Pub. No.: WO2020/050259
PCT Pub. Date: Mar. 12, 2020

(65) Prior Publication Data
US 2021/0187624 A1 Jun. 24, 2021

(30) Foreign Application Priority Data
Sep. 5, 2018 (JP) .................. 2018-166097

(51) Int. Cl.
B23B 27/14 (2006.01)
B22F 5/00 (2006.01)
C23C 16/36 (2006.01)
C23C 16/40 (2006.01)

(52) U.S. Cl.
CPC .............. B23B 27/148 (2013.01); B22F 5/00 (2013.01); C23C 16/36 (2013.01); C23C 16/403 (2013.01); B22F 2005/001 (2013.01); B22F 2302/10 (2013.01); B23B 2228/10 (2013.01)

(58) Field of Classification Search
None
See application file for complete search history.

(56) References Cited

U.S. PATENT DOCUMENTS 5,915,162 A 6/1999 Uchino et al.
6,344,265 B1 * 2/2002 Blomstedt ............. C23C 30/005
407/119
6,756,111 B1 6/2004 Okada et al.
(Continued)

FOREIGN PATENT DOCUMENTS

EP 2703102 A1 3/2014
JP H07100701 A 4/1995
(Continued)

Primary Examiner — Seth Dumbris
(74) Attorney, Agent, or Firm — VIERING, JENTSCHURA & PARTNER MBB

(57) ABSTRACT

A coated tool may include a base member including a first surface, and a coating layer located on the first surface. On the first surface, scattered island portions may include 70 area % or more of a binder phase and have an equivalent circle diameter of 10 μm or more. The coating layer may include a first layer including a titanium compound and located on the first surface, and a second layer including aluminum oxide and located on and in contact with the first layer. The coating layer may include a plurality of voids. An average value of widths of the voids in the direction along the boundary may be less than an average value of distances between the voids adjacent to each other.

9 Claims, 7 Drawing Sheets

(56) References Cited

U.S. PATENT DOCUMENTS

| | | |
|---|---|---|
| 9,987,687 B2 | 6/2018 | Lindahl et al. |
| 11,253,926 B2 | 2/2022 | Katsuma |
| 2005/0123366 A1 | 6/2005 | Goudemond et al. |
| 2006/0003187 A1 | 1/2006 | Osada et al. |
| 2009/0044415 A1 | 2/2009 | Fujino et al. |
| 2012/0202032 A1 | 8/2012 | Tatsuoka et al. |
| 2014/0193624 A1 | 7/2014 | Stiens et al. |
| 2014/0308083 A1 | 10/2014 | Bjormander |
| 2015/0003925 A1 | 1/2015 | Östlund et al. |
| 2016/0138153 A1 | 5/2016 | Sobiech et al. |
| 2016/0175940 A1 | 6/2016 | Lindahl et al. |
| 2017/0190591 A1 | 7/2017 | Imamura et al. |
| 2017/0259344 A1 | 9/2017 | Katsuma |
| 2019/0039148 A1 | 2/2019 | Kubo et al. |
| 2019/0232380 A1 | 8/2019 | Kanaoka et al. |
| 2021/0187623 A1 | 6/2021 | Katsuma |
| 2021/0197289 A1 | 7/2021 | Katsuma |
| 2021/0220920 A1 | 7/2021 | Katsuma |
| 2021/0245260 A1 | 8/2021 | Katsuma |
| 2021/0339320 A1 | 11/2021 | Katsuma |

FOREIGN PATENT DOCUMENTS

| | | |
|---|---|---|
| JP | H08300203 A | 11/1996 |
| JP | 2000071108 A | 3/2000 |
| JP | 2006015426 A | 1/2006 |
| JP | 2006116621 A | 5/2006 |
| JP | 2006231422 A | 9/2006 |
| JP | 2009107028 A | 5/2009 |
| JP | 2012187659 A | 10/2012 |
| JP | 2013126709 A | 6/2013 |
| JP | 2015009358 A | 1/2015 |
| JP | 2015182209 A | 10/2015 |
| JP | 2015188995 A | 11/2015 |
| JP | 6026468 B2 | 11/2016 |
| JP | 2017042901 A | 3/2017 |
| JP | 6238904 B2 | 11/2017 |
| JP | 2017221992 A | 12/2017 |
| JP | 2018103288 A | 7/2018 |
| WO | 0079022 A1 | 12/2000 |
| WO | 2006104004 A1 | 10/2006 |
| WO | 2012144088 A1 | 10/2012 |
| WO | 2017146200 A1 | 8/2017 |
| WO | 2017204141 A1 | 11/2017 |

\* cited by examiner

COATED TOOL AND CUTTING TOOL

CROSS-REFERENCE TO RELATED APPLICATIONS

This application is a national stage entry according to 35 U.S.C. § 371 of PCT Application No. PCT/JP2019/034595 filed on Sep. 3, 2019, which claims priority to Japanese Application No. 2018-166097 filed on Sep. 5, 2018, which are entirely incorporated herein by reference.

TECHNICAL FIELD

The present disclosure relates to a coated tool for use in a cutting process.

BACKGROUND

As a coated tool for use in a cutting process, such as a turning process and a milling process, a coated tool is discussed in, for example, Patent Document 1 (WO 2006/104004). In a cutting tool discussed in Patent Document 1, it is discussed that adhesion between a base member and a coating layer may be increased by providing an island portion structure in which a plurality of binder-phase-aggregated portions, obtained by aggregating cobalt (Co) and nickel (Ni) as binder phases, are scattered on the surface of the base member, for example, as illustrated in FIG. 2 of Patent Document 1.

Patent Document 2 (Japanese Unexamined Patent Publication No. 2015-182209) discusses a coated tool in which a coating layer having a layer including a titanium (Ti) compound (titanium compound layer) and a layer including aluminum oxide ($Al_2O_3$) (aluminum oxide layer) may be formed on the surface of a base member made of cemented carbide or the like. In the coated tool discussed in Patent Document 2, it is discussed that a plurality of voids may be formed at an interface between the titanium compound layer and the aluminum oxide layer, and an impact relaxation effect may be obtained by these plurality of voids.

As discussed in these patent documents, the adhesion between the base member and the coating layer and the impact relaxation effect of the coating layer may be enhanced in the coated tool.

SUMMARY

A coated tool of the present disclosure may include a base member including a first surface, and a coating layer located on the first surface. The base member may include a hard phase with tungsten carbide particles, and a binder phase including at least one of cobalt and nickel. Further, island portions each including 70 area % or more of the binder phase and having an equivalent circle diameter of 10 μm or more may be scattered on the first surface. The coating layer may include a first layer including a titanium compound and located on the first surface, and a second layer including aluminum oxide and located on and in contact with the first layer. The coating layer may include a plurality of voids located in the first layer in a cross section orthogonal to the first surface so as to be arranged side by side in a direction along a boundary between the first layer and the second layer. An average value of widths of the voids in the direction along the interface may be smaller than an average value of distances between the voids adjacent to each other.

A cutting tool of the present disclosure may include a holder, which includes a bar shape extending from a first end to a second end and includes a pocket located at a side of the first end, and the above-described coated tool located at the pocket.

DETAILED DESCRIPTION

Hereinafter, a coated tool 1 of the present disclosure will be described in detail with reference to the drawings. However, each of the drawings referred to in the following illustrates, in a simplified form, only main members necessary for the description. Therefore, the coated tool can include any structural member not illustrated in each of the drawings referred to. In addition, dimensions of the members in each of the drawings are not ones which faithfully represent dimensions of actual structural members and dimension ratios of these members.

<Coated Tool>

Figure 1:
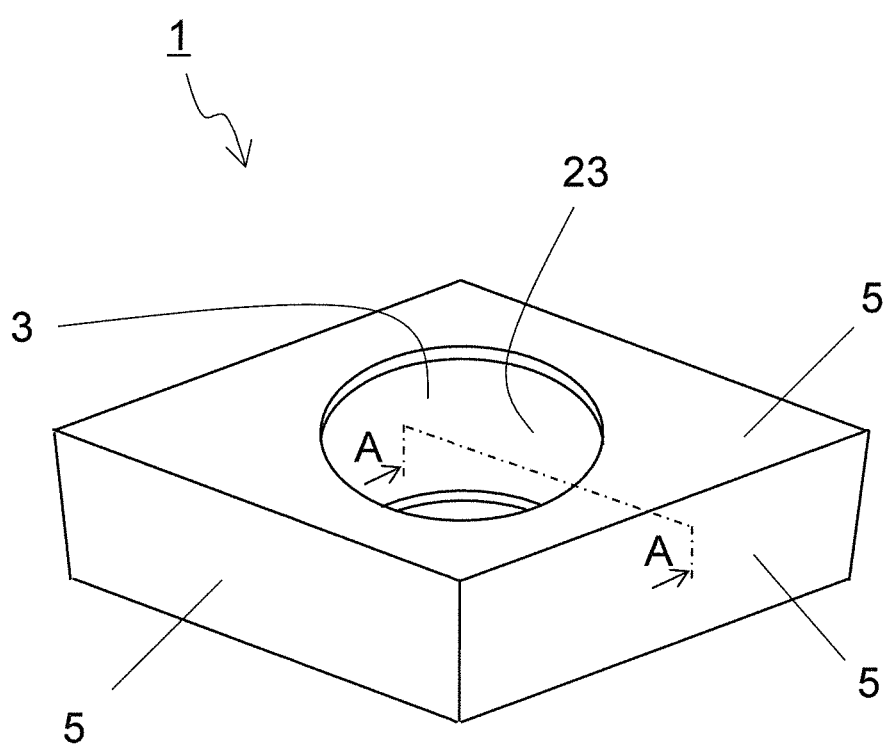
FIG. 1 is a perspective view illustrating a coated tool of the present disclosure.
Figure 2:
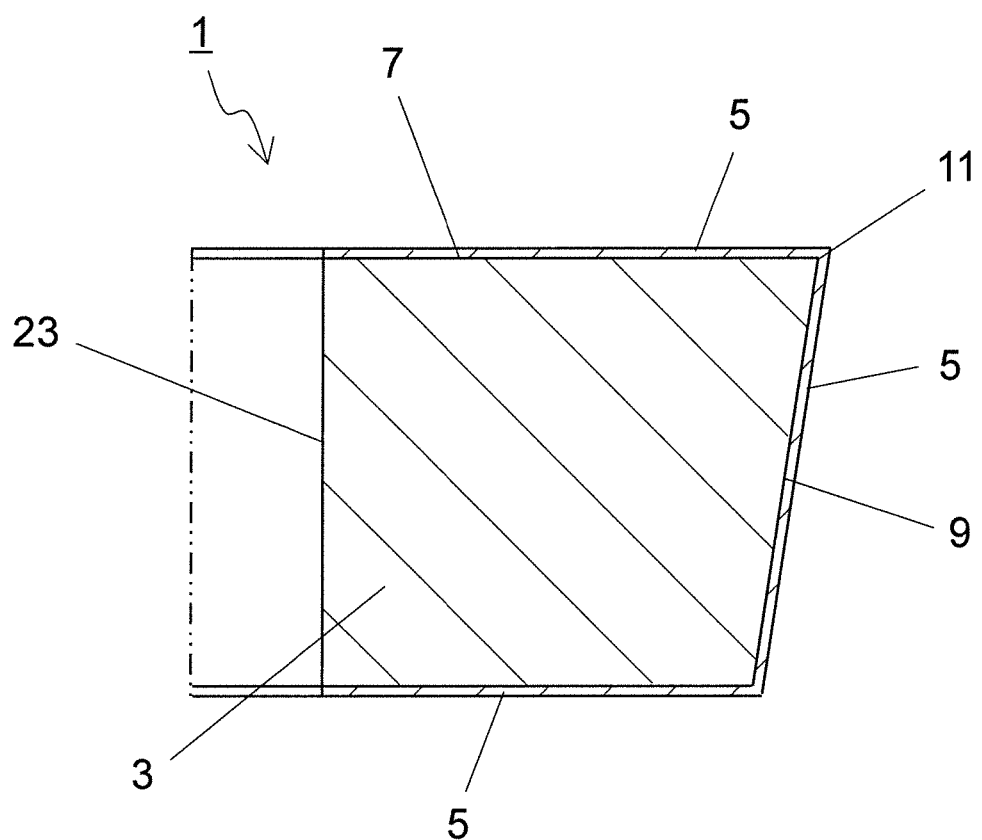
FIG. 2 is a sectional view taken along line A-A in the coated tool illustrated in FIG. 1.

As illustrated in FIGS. 1 and 2, a coated tool 1 of the present disclosure includes a base member 3 and a coating layer 5. The base member 3 includes a first surface 7 (an upper surface in FIG. 2), a second surface 9 (a side surface in FIG. 2) adjacent to the first surface 7, and a cutting edge 11 located on at least a part of a ridge line where the first surface 7 intersects with the second surface 9.

The base member 3 in the example illustrated in FIG. 1 has a quadrangular plate shape, and the first surface 7 is a quadrangle. Therefore, the number of the second surfaces 9 is four. At least a part of the first surface 7 is a rake surface region, and at least a part of the second surface 9 is a flank surface region. Note that the shape of the base member 3 is not limited to the quadrangular plate shape, and the first surface 7 may be, for example, a triangle, a pentagon, a hexagon, or a circle. In addition, the base member 3 is not limited to the plate shape, and may be, for example, a columnar shape.

The base member 3 includes, for example, at least one of cobalt and nickel in an amount of 5 to 10 mass %, and also includes hard phases composed of WC, metal carbide, nitride, and carbonitride. A mean particle size of these hard phases may be 3 μm or less in one non-limiting embodiment or 1 μm or less in another non-limiting embodiment from the viewpoint of increasing hardness.

A plurality of binder-phase-aggregated portions in which binder phases are aggregated are scattered on the surface of the base member 3. This binder-phase-aggregated portion is also called an island portion, and it is called that the surface includes a sea-island structure as a way of expressing a portion other than this island portion as the sea. Note that the binder-phase-aggregated portion refers to a portion including 70 area % or more of the binder phase relative to the area of a region where a color difference has been confirmed in a top view or a sectional view with a scanning electron microscope (SEM) or the like. If the portion where the color difference has been confirmed is the binder-phase-aggregated portion (island portion), a ratio occupied by the binder phase is smaller than 70 area % in a region corresponding to the sea other than the binder-phase-aggregated portion.

The binder-phase-aggregated portion has an equivalent circle diameter of 10 µm or more if viewed from a direction perpendicular to the first surface 7 which is the surface of the base member 3. In addition, the equivalent circle diameter may be 50 µm or more. Further, the equivalent circle diameter may be 300 µm or less. In addition, an area ratio of the binder-phase-aggregated portion may be 10 to 70 area % on the surface of the base member 3. The base member 3 including the binder-phase-aggregated portion in such a range of the equivalent circle diameter has excellent bondability between the base member 3 and the coating layer.

The above-described equivalent circle diameter and area ratio of the binder-phase-aggregated portion can be analyzed using, for example, image analysis software after capturing a reflected electron image using a SEM. The analysis is facilitated by emphasizing the color difference between the binder-phase-aggregated portion and the other portion during capturing or using the image analysis software. In addition, a device capable of mapping for each type of element such as WDS may be used. In either case, for example, it may be preferable to capture a photograph by adjusting the magnification such that a plurality of binder-phase-aggregated portions fit in one photograph, and calculate the equivalent circle diameter and area ratio using the image analysis software. The area to be measured may be 1 mm×1 mm. In addition, the number of binder-phase-aggregated portions to be measured may be at least ten or more. Note that if the base member 3 includes a through hole 23 and the surface of the base member 3 is exposed in the through hole 23, the surface of the through hole 23 may be regarded as the surface of the base member 3 to identify the size or area of the binder-phase-aggregated portion. In addition, if the surface of the base member 3 is not exposed, the size or area of the binder-phase-aggregated portion may be identified after removing the coating layer 5.

The coating layer 5 is located on at least the first surface 7 of the base member 3. The coating layer 5 may be located only on the first surface 7, or may be located on a surface other than the first surface 7 of the base member 3. In the example illustrated in FIG. 2, the coating layer 5 is located on the second surface 9 in addition to the first surface 7. The coating layer 5 is provided to improve characteristics of the coated tool 1 during a cutting process, such as wear resistance and chipping resistance.

The base member 3 may include the through hole 23 that passes through the first surface 7 and a surface located on the opposite side of the first surface 7. The through hole 23 can be used to insert a fixing member configured to fix the coated tool 1 to a holder. Examples of the fixing member include a screw and a clamping member.

The size of the base member 3 is not particularly limited. For example, a length of one side of the first surface 7 is set to approximately 3 to 20 mm. In addition, a height from the first surface 7 to the surface located on the opposite side of the first surface 7 is set to approximately 5 to 20 mm.

Figure 3:
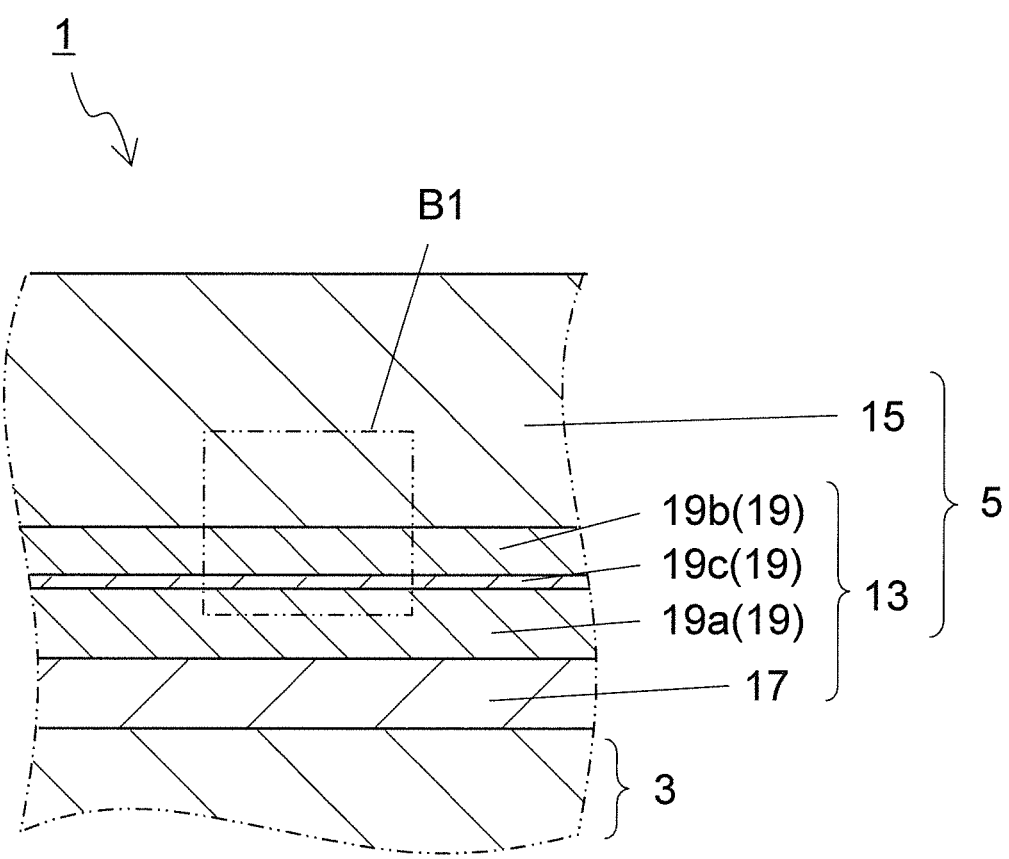
FIG. 3 is an enlarged view in the vicinity of a coating layer in the coated tool illustrated in FIG. 2.

As illustrated in FIG. 3, the coating layer 5 includes a first layer 13 and a second layer 15. The first layer 13 is located on the first surface 7 and includes a titanium compound. In addition, the second layer 15 is located on and in contact with the first layer 13 and includes aluminum oxide ($Al_2O_3$). Note that the binder-phase-aggregated portion is omitted in FIG. 3.

An insert 1 of the present disclosure including the binder-phase-aggregated portion has excellent bondability between the base member 3 and the coating layer 5.

Examples of the titanium compound included in the first layer 13 include titanium carbide, nitride, oxide, carbonitride, carbon oxide, and oxycarbonitride. The first layer 13 may have a configuration including only one of the above compounds, or may have a configuration including a plurality of the above compounds.

In addition, the first layer 13 may have a single-layer configuration as long as it includes the titanium compound, or may have a configuration in which a plurality of layers are laminated. For example, the first layer 13 may have a configuration in which a titanium nitride layer 17 and a titanium carbonitride layer 19 are laminated. If the first layer 13 includes the titanium nitride layer 17, the adhesion between the base member 3 and the first layer 13 is even higher. Note that the titanium nitride layer 17 and the titanium carbonitride layer 19 include, as main components, titanium nitride and titanium carbonitride, respectively, and may include other components. In addition, the above-described "main component" means that the component has the largest mass % value among the components of the titanium nitride layer 17 and the titanium carbonitride layer 19.

The coating layer 5 may be configured using only the first layer 13 and the second layer 15, or may include a layer other than these layers. For example, another layer may exist between the base member 3 and the first layer 13, and another layer may exist on the second layer 15.

In addition, the titanium carbonitride layer 19 may be configured such that a plurality of regions including different compositions are laminated. For example, the titanium carbonitride layer 19 may have a configuration in which a so-called moderate temperature (MT)-first region 19*a* and a so-called high temperature (HT)-second region 19*b* are laminated.

If the first layer 13 includes the first region 19*a* and the second region 19*b*, the first layer 13 may further include an intermediate region 19*c* between the first region 19*a* and the second region 19*b*. Note that boundaries among the above layers and regions can be identified by observing, for example, a SEM photograph or a transmission electron microscope (TEM) photograph). This identification can be performed based on a ratio of elements constituting each layer and a difference in crystal size and orientation.

In addition, examples of the aluminum oxide included in the second layer 15 include α-alumina (α-$Al_2O_3$), γ-alumina (γ-$Al_2O_3$), and κ-alumina (κ-$Al_2O_3$). If the second layer 15 includes α-alumina among these, the heat resistance of the coated tool 1 can be enhanced. The second layer 15 may have a configuration including only one of the above compounds, or may have a configuration including a plurality of the above compounds.

Which of the above compounds the aluminum oxide included in the second layer 15 is can be evaluated by, for example, performing X-ray diffraction (XRD) analysis and observing the distribution of peak values.

A content ratio of the titanium compound in the first layer 13 and a content ratio of the aluminum oxide in the second layer 15 are not limited to specific values. As an example, a configuration is given in which the first layer 13 includes the titanium compound as a main component, and the second layer 15 includes the aluminum oxide as a main component.

Note that the above-described "main component" means that the component has the largest mass % value among the components of the first layer 13 and the second layer 15 as described above.

The first layer 13 may include a component other than the titanium compound, and the second layer 15 may include a component other than aluminum oxide. For example, if the first layer 13 includes aluminum oxide or if the second layer 15 includes a titanium compound, the bondability between the first layer 13 and the second layer 15 is improved.

Figure 4:
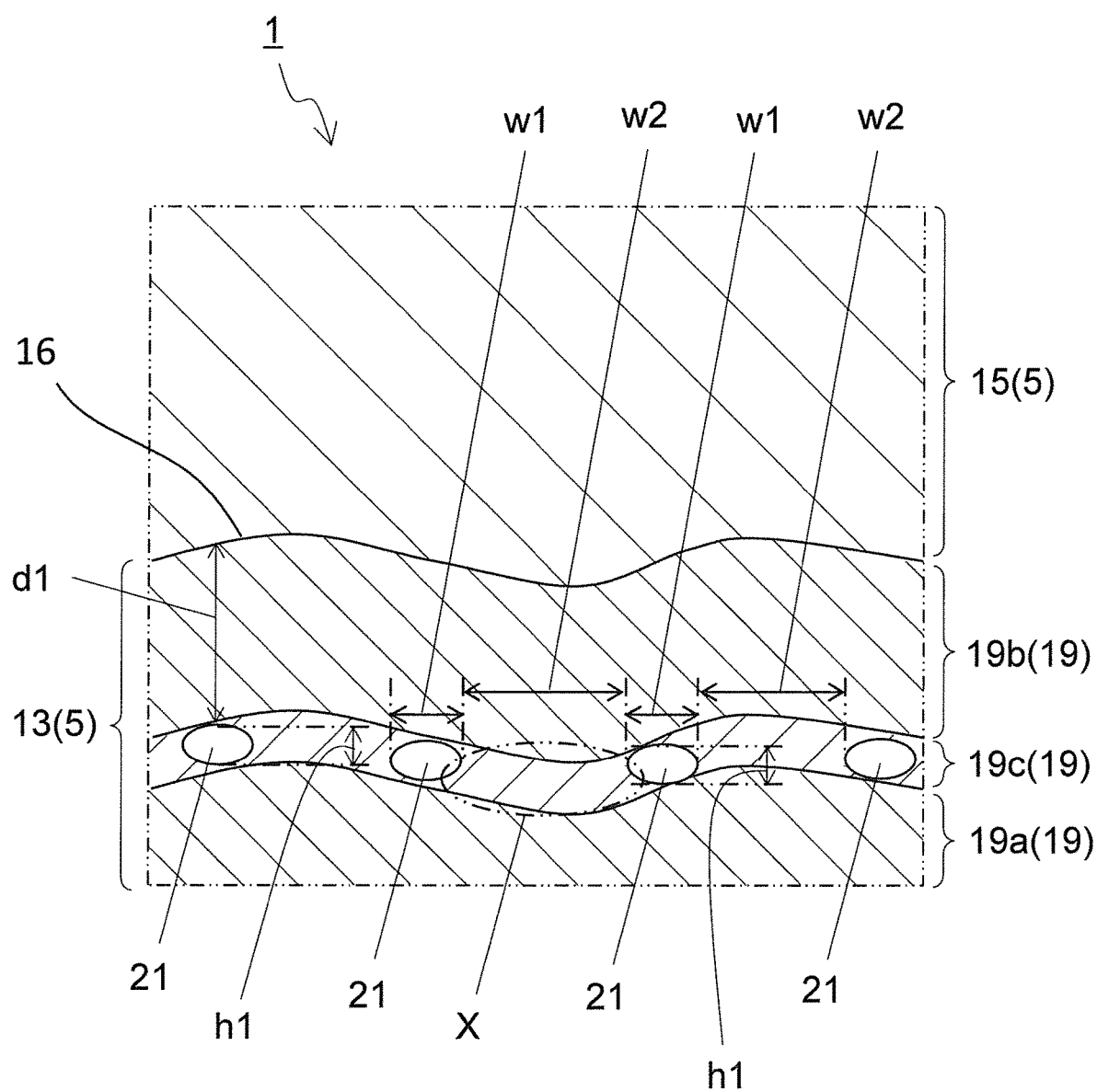
FIG. 4 is an enlarged view illustrating an example of a region B1 illustrated in FIG. 3.

As illustrated in FIG. 4, the coating layer 5 includes voids 21 inside the first layer 13. Specifically, in a cross section orthogonal to the first surface 7 of the base member 3, the first layer 13 of the coating layer 5 includes the plurality of voids 21 located side by side in a direction along a boundary 16 between the first layer 13 and the second layer 15.

In addition, in the cross section orthogonal to the first surface 7, an average value of widths $w_1$ of the voids 21 in a direction parallel to the first surface 7 is smaller than an average value of distances between the voids 21 adjacent to each other, that is, an average value of widths $w_2$ of first portions X. The coated tool 1 satisfying such a configuration can obtain high impact resistance in the voids 21 while suppressing a decrease in strength of the first portion X. Therefore, an effect of mitigating the impact can be obtained by the voids 21 while suppressing a decrease in the bondability between the first layer 13 and the second layer 15.

Note that it is unnecessary to evaluate the widths $w_1$ of all the voids 21 existing in the cross section orthogonal to the first surface 7 if the average value of the widths $w_1$ of the voids 21 in the direction parallel to the first surface 7 is evaluated, and the evaluation only has to be performed using an average value of the widths $w_1$ of approximately five to ten voids 21 located side by side in the cross section. For example, the following processes only have to be performed: a 10 μm square region including the boundary 16 between the first layer 13 and the second layer 15 is extracted in the cross section orthogonal to the first surface 7, and the widths $w_1$ of the voids 21 in the region is measured. In addition, an average value of the widths $w_2$ of the first portion X only has to be evaluated using an average value of distances among approximately five to ten voids 21 located side by side in the cross section. Note that there may be other cases of determining an average value in the present disclosure. An average value of approximately five to ten values may be obtained in each of the cases.

Figure 5:
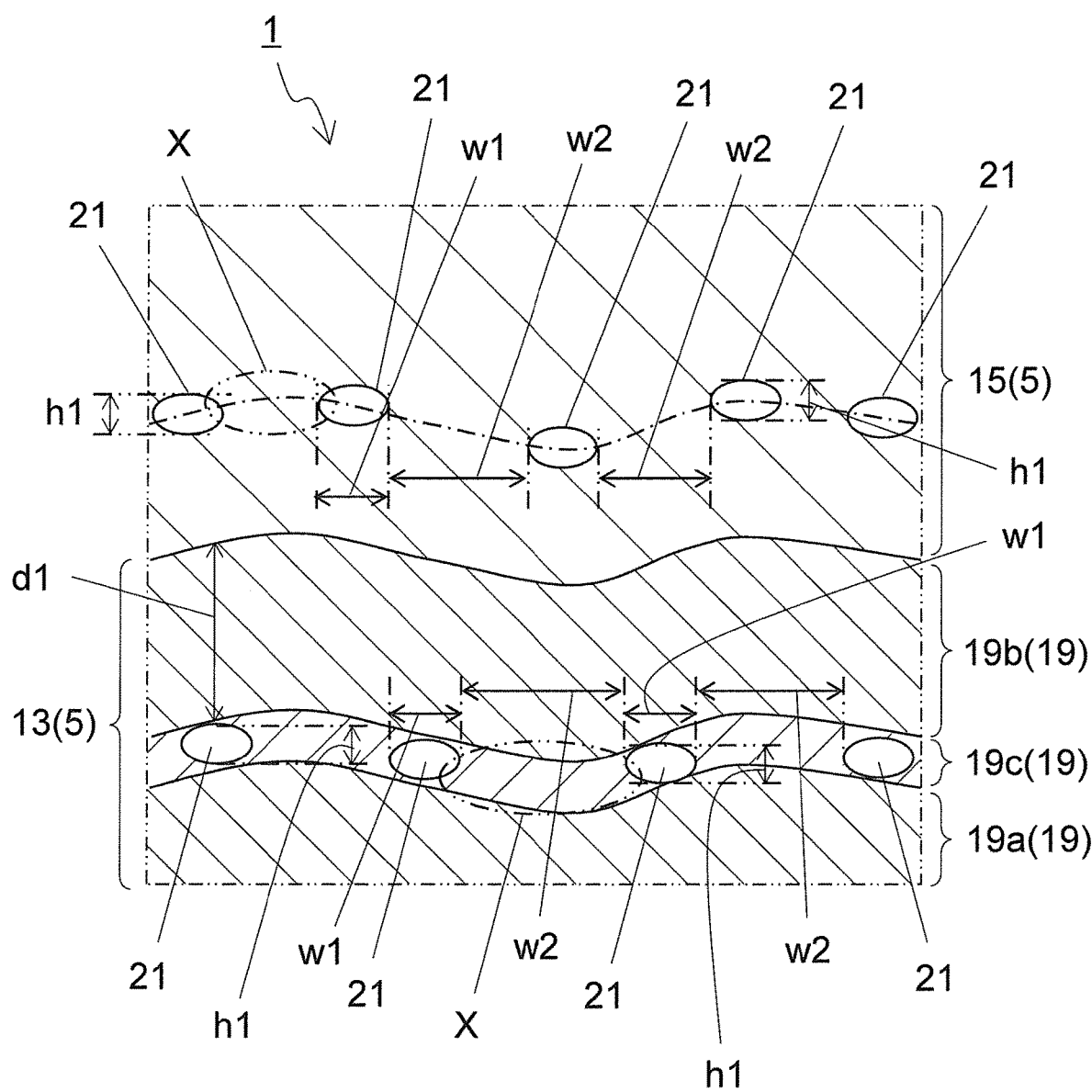
FIG. 5 is an enlarged view illustrating another example of the region B1 illustrated in FIG. 3.

The voids 21 may exist in the first layer 13. For example, not only the configuration of being located in the first layer 13 as illustrated in FIG. 4 but also a configuration of being located in each of the first layer 13 and the second layer 15 as illustrated in FIG. 5 may be adopted. In FIG. 5, an imaginary line segment along the boundary 16 between the first layer 13 and the second layer 15 is indicated by a chain line. The voids 21 located in the second layer 15 may be located along the boundary 16 between the first layer 13 and the second layer 15.

Note that the phrase that "the voids 21 are located along the boundary 16 between the first layer 13 and the second layer 15" refers to that distances from the plurality of voids 21 to the boundary 16 between the first layer 13 and the second layer 15 fall within a range of ±20% of an average value thereof.

The durability of the coated tool 1 is further enhanced if the plurality of voids 21 are located in the first layer 13 in the case where the first layer 13 includes titanium carbonitride as the titanium compound and the second layer 15 includes α-alumina as the aluminum oxide from the viewpoint of heat resistance and durability of the coated tool 1.

This is because the impact resistance due to the voids 21 can be enhanced in the first layer 13 since the voids 21 are located in the first layer 13 although titanium nitride has a higher hardness than α-alumina but has a lower impact resistance, and the durability of the coated tool 1 is further enhanced.

The size of the void 21 is not particularly limited, but can be set to, for example, 20 to 200 nm. If the size of the void 21 is 20 nm or more, the impact relaxation effect by the void 21 can be enhanced. In addition, if the size of the void 21 is 200 nm or less, the strength of the first layer 13 can be easily maintained. Note that the size of the void 21 means the maximum value of the width $w_1$ of the void 21 in the cross section orthogonal to the first surface 7.

In addition, the shape of the voids 21 is not particularly limited, but it is possible to further enhance the impact resistance while suppressing the ratio of the voids 21 if the width $w_1$ in the direction parallel to the first surface 7 is larger than a height $h_1$ in a direction orthogonal to the first surface 7 in the cross section orthogonal to the first surface 7, in other words, if the average value of the widths $w_1$ of the voids 21 in the direction parallel to the first surface 7 is larger than an average value of the heights $h_1$ of the voids 21 in the direction orthogonal to the first surface 7. A reason thereof is given as follows.

During a cutting process of a workpiece to manufacture a machined product, a cutting load is likely to be applied to the coating layer 5 in the direction orthogonal to the first surface 7. At this time, the cutting load can be absorbed in a wide range of the voids 21 without making the voids 21 larger than necessary if the void 21 has a shape in which the width $w_1$ in the direction parallel to the first surface 7 is larger than the height $h_1$ in the direction orthogonal to the first surface 7. Therefore, the impact resistance can be further improved while suppressing the ratio of the voids 21. Note that the height $h_1$ in the direction in which the void 21 is orthogonal to the first surface 7 is the maximum value of the height $h_1$ in the direction in which the void 21 is orthogonal to the first surface 7.

Specifically, it is easy to absorb the cutting load in the wide range of the voids 21 if a ratio of the average value of the widths $w_1$ of the voids 21 in the direction orthogonal to the first surface 7 relative to the average value of the heights $h_1$ of the voids 21 in the direction parallel to the first surface 7 is 1.2 or more. In addition, if the above ratio is 2 or less, the amount of deformation of the void 21 in the direction orthogonal to the first surface 7 can be easily secured, so that it is easy to stably absorb the cutting load in the void 21.

If the maximum height of the boundary between the first surface 7 and the second surface 9 in the cross section orthogonal to the first surface 7 is Rz, it is easy to suppress a decrease in the durability of the coating layer 5 in a case where the average value of the heights $h_1$ of the voids 21 in the direction orthogonal to the first surface 7 is smaller than Rz.

The coated tool 1 of the present disclosure has a high impact resistance due to the deformation of the first portion X located between the adjacent voids 21 and the plurality of voids 21 in the first layer 13. Here, if the average value of the widths of the voids 21 in the direction orthogonal to the first surface 7 is smaller than Rz, an imaginary line connecting the adjacent voids 21 is illustrated in a zigzag shape that is bent greater than the width of the voids 21.

If the imaginary line is illustrated in the above shape, even if a crack occurs in one of the first portions X, it is difficult for a crack to grow in the first portion X located adjacent to the first portion X where the above crack has occurred. Therefore, the durability of the coating layer 5 hardly decreases.

In addition, the durability of the coating layer 5 hardly decreases even in a case where an average value of distances dl from the voids 21 to the boundary 16 between the first layer 13 and the second layer 15 is larger than the average value of the widths w2 of the first portion X in the cross section orthogonal to the first surface 7. Note that the distance dl from the void 21 to the boundary 16 between the first layer 13 and the second layer 15 is the minimum value of the distance of the void 21 with respect to the boundary 16.

This is because, even if a crack occurs in one of the first portions X, the crack hardly reaches the boundary 16 between the first layer 13 and the second layer 15 since the distance from the void 21 to the boundary 16 between the first layer 13 and the second layer 15 can be sufficiently secured as compared with the first portion X in the above case. Since the above crack hardly reaches the boundary 16 between the first layer 13 and the second layer 15, the bondability between the first layer 13 and the second layer 15 hardly decreases.

The void 21 is located in the first layer 13 and is located away from the boundary between the first layer 13 and the second layer 15. Here, the bondability between the first layer 13 and the second layer 15 hardly decreases while improving the impact resistance of the coating layer 5 in a case where the average value of the distances dl from the voids 21 to the boundary 16 between the first layer 13 and the second layer 15 is larger than the average value of the heights h1 of the voids 21 in the direction orthogonal to the first surface 7 in the cross section orthogonal to the first surface 7.

This is because the boundary 16 between the first layer 13 and the second layer 15 is not deformed, or the amount of deformation is sufficiently small even if the void 21 is deformed to absorb the cutting load since the distance from the void 21 to the boundary 16 between the first layer 13 and the second layer 15 can be sufficiently secured as compared with the size of the void 21. Since it is difficult for the boundary 16 between the first layer 13 and the second layer 15 to be largely deformed, the bondability between the first layer 13 and the second layer 15 hardly decreases.

<Manufacturing Method>

Next, an example of a method for manufacturing the coated tool according to the present disclosure will be described.

First, a mixed powder is manufactured by suitably adding metal powder, carbon powder, or the like to inorganic powder selected from carbide, nitride, carbonitride, oxide, and the like, which are capable of forming a hard alloy constituting the base member 3 by sintering, and then by mixing the resultant.

For example, 79 to 94.8 mass % of a tungsten carbide (WC) powder including a mean particle size of 1.0 µm or less, 0.1 to 3.0 mass % of a vanadium carbide (VC) powder including a mean particle size of 0.3 to 1.0 µm, 0.1 to 3 mass % of a chromium carbide ($Cr_3C_2$) powder including a mean particle size of 0.3 to 2.0 µm, 5 to 15 mass % of metallic cobalt (Co) including a mean particle size of 0.2 to 0.6 µm, and further, a metallic tungsten (W) powder or carbon black (C), as needed, are mixed.

Next, at the time of the above mixing, an organic solvent such as methanol is added such that a solid content of a slurry becomes 60 to 80 mass %, and then, a proper dispersing agent is added. After the mixed powder is homogenized by grinding in a grinding device such as a ball mill and a vibrating mill for 10 to 20 hours as a grinding time, an organic binder such as paraffin is added to the mixed powder to obtain a mixed powder for molding.

Further, after molding into a predetermined shape by a known molding method such as press-molding, casting molding, extrusion molding, cold isostatic press-molding, or the like using the mixed powder, the resultant is sintered under a pressure of 0.01 to 0.6 MPa in an argon gas at 1350 to 1450° C., and desirably 1375 to 1425° C. for 0.2 to 2 hours, and then, cooled to a temperature of 800° C. or lower at a rate of 55 to 65° C./minute, thereby obtaining the base member 3.

Here, among the above sintering conditions, if the sintering temperature is lower than 1350° C., it is difficult to densify the alloy so that the hardness decreases. Conversely, if the sintering temperature exceeds 1450° C., both hardness and strength decrease due to grain growth of WC particles. In addition, if the sintering temperature deviates from the above range, or if the gas atmosphere is less than 0.01 MPa or more than 0.6 MPa during sintering, no binder-phase-aggregated portion is generated in either case so that a heat dissipation property on the surface of the cemented carbide decreases. In addition, if the atmosphere during sintering is set to the $N_2$ gas atmosphere, no binder-phase-aggregated portion is generated. In addition, no binder-phase-aggregated portion is generated if the cooling rate is slower than 55° C./minute, and the area ratio of the binder-phase-aggregated portion becomes too large if the cooling rate is faster than 65° C./minute.

Note that the surface of the base member 3 may be subjected to a polishing process and a honing process as needed.

Next, the coating layer 5 is formed on the surface of the base member 3 by a chemical vapor deposition (CVD) method.

First, the titanium nitride layer 17 (underlayer) in the first layer 13 is deposited. A first mixed gas used as a reaction gas is manufactured by mixing 0.5 to 10 vol % of a titanium tetrachloride gas and 10 to 60 vol % of a nitrogen gas with a hydrogen ($H_2$) gas. The first mixed gas is introduced into a chamber at a gas partial pressure of 10 to 20 kPa to deposit the titanium nitride layer 17 in a temperature range of 830 to 870° C.

Next, the first region 19a in the first layer 13 is deposited. A second mixed gas is manufactured by mixing 0.5 to 10 vol % of a titanium tetrachloride gas, 5 to 60 vol % of a nitrogen gas, and 0.1 to 3 vol % of an acetonitrile gas with a hydrogen gas. The second mixed gas is introduced into the chamber at a gas partial pressure of 6 to 12 kPa to deposit the first region 19a including MT-titanium carbonitride in a temperature range of 830 to 870° C.

Next, the intermediate region 19c is deposited. A third mixed gas is manufactured by mixing 3 to 30 vol % of a titanium tetrachloride gas, 3 to 15 vol % of a methane gas, 5 to 10 vol % of a nitrogen gas, and 0.5 to 5 vol % of a carbon dioxide ($CO_2$) gas with a hydrogen gas. The third mixed gas is introduced into the chamber at a gas partial pressure of 6 to 12 kPa to deposit the intermediate region 19c including a thickness of approximately 50 to 300 nm in a temperature range of 980 to 1050° C. Since the third mixed gas includes the carbon dioxide gas, the voids 21 are formed in this intermediate region 19c. In addition, it is possible to manufacture the coated tool 1 in which the average value of the widths w1 of the voids 21 in the direction parallel to the first surface 7 is smaller than the average value of the distances w2 between the voids 21 adjacent to each other in the cross section orthogonal to the first surface 7.

In addition, at this time, the thickness of the intermediate region 19c is as thin as approximately 50 to 300 nm, and thus, the voids 21 formed in the intermediate region 19c can be located side by side in the direction along the boundary 16 between the first layer 13 and the second layer 15.

Next, the second region 19b in the first layer 13 is deposited. A fourth mixed gas is manufactured by mixing 1 to 4 vol % of a titanium tetrachloride gas, 5 to 20 vol % of a nitrogen gas, 0.1 to 10 vol % of a methane gas, and 0.5 to 10 vol % of a carbon dioxide gas with a hydrogen gas. The fourth mixed gas is introduced into the chamber at a gas partial pressure of 5 to 45 kPa to deposit the second region 19b including HT-titanium carbonitride with a thickness of approximately 0.3 to 3 μm in a temperature range of 950 to 1050° C.

Next, the second layer 15 is deposited. A fifth mixed gas is manufactured by setting a deposition temperature to 950 to 1100° C. and a gas pressure to 5 to 20 kPa and mixing 5 to 15 vol % of an aluminum trichloride ($AlCl_3$) gas, 0.5 to 2.5 vol % of a hydrogen chloride (HCl) gas, 0.5 to 5.0 vol % of a carbon dioxide gas, and 0 to 1 vol % of a hydrogen sulfide ($H_2S$) gas with a hydrogen gas as a reaction gas composition. The fifth mixed gas is introduced into the chamber to deposit the second layer 15.

Thereafter, as needed, a polishing process is carried out on a part of the surface of the deposited coating layer 5 at which the cutting edge 11 is located. If the polishing process is carried out, a workpiece is less likely to be welded onto the cutting edge 11, thus leading to the coated tool 1 having more excellent fracture resistance.

Note that the above manufacturing method is an example of the method for manufacturing the coated tool 1. Therefore, it is a matter of course that the coated tool 1 is not limited to one manufactured by the above manufacturing method. For example, a third layer may be additionally deposited on the second layer 15.

In order to manufacture the coated tool 1 in which the average value of the widths w1 of the voids 21 in the direction parallel to the first surface 7 is larger than an average value of the heights h1 of the voids 21 in the direction orthogonal to the first surface 7 in the cross section orthogonal to the first surface 7, time adjustment may be carried out during the deposition of the intermediate region 19c so that the intermediate region 19c is deposited in a thickness of approximately 50-150 nm.

In order to manufacture the coated tool 1 in which an average value of the distances dl from the voids 21 to the boundary 16 is larger than an average value of the heights h1 of the voids 21 in the direction orthogonal to the first surface 7 in the cross section orthogonal to the first surface 7, time adjustment may be carried out during the deposition of the intermediate region 19c so as to be deposited in a thickness of approximately 50-150 nm, and thereafter the second region 19b in the first layer 13 may be deposited in a thickness of approximately 0.5-3 μm. In order to manufacture the coated tool 1 in which an average value of the distances dl from the voids 21 to the boundary 16 is larger than an average value of the distances w2 of the voids 21 adjacent to each other in the cross section orthogonal to the first surface, the second region 19b in the first layer 13 may be deposited so as to be thicker than the average value of the distances w2 of the voids 21 adjacent to each other.

<Cutting Tool>

Next, a cutting tool 101 of the present disclosure will be described with reference to the drawings.

Figure 6:
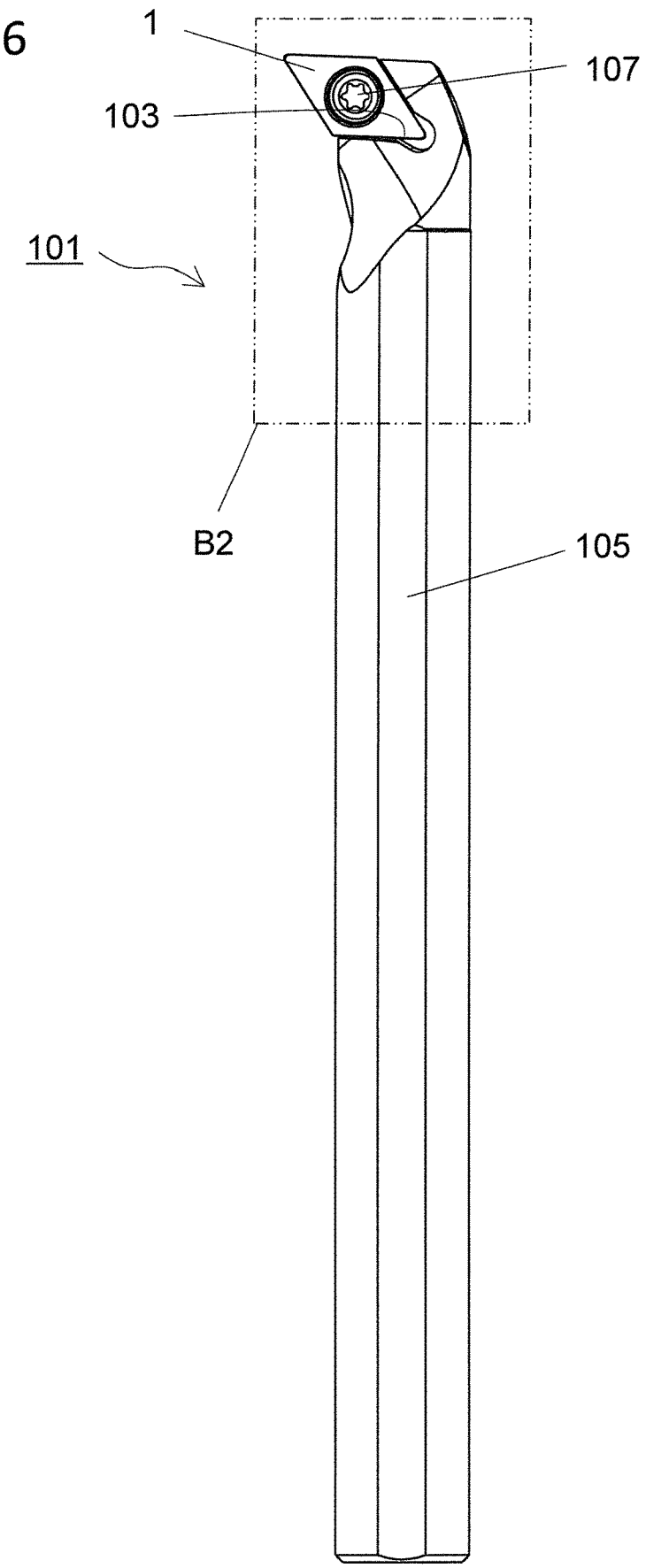
FIG. 6 is a plan view illustrating a cutting tool of the present disclosure.
Figure 7:
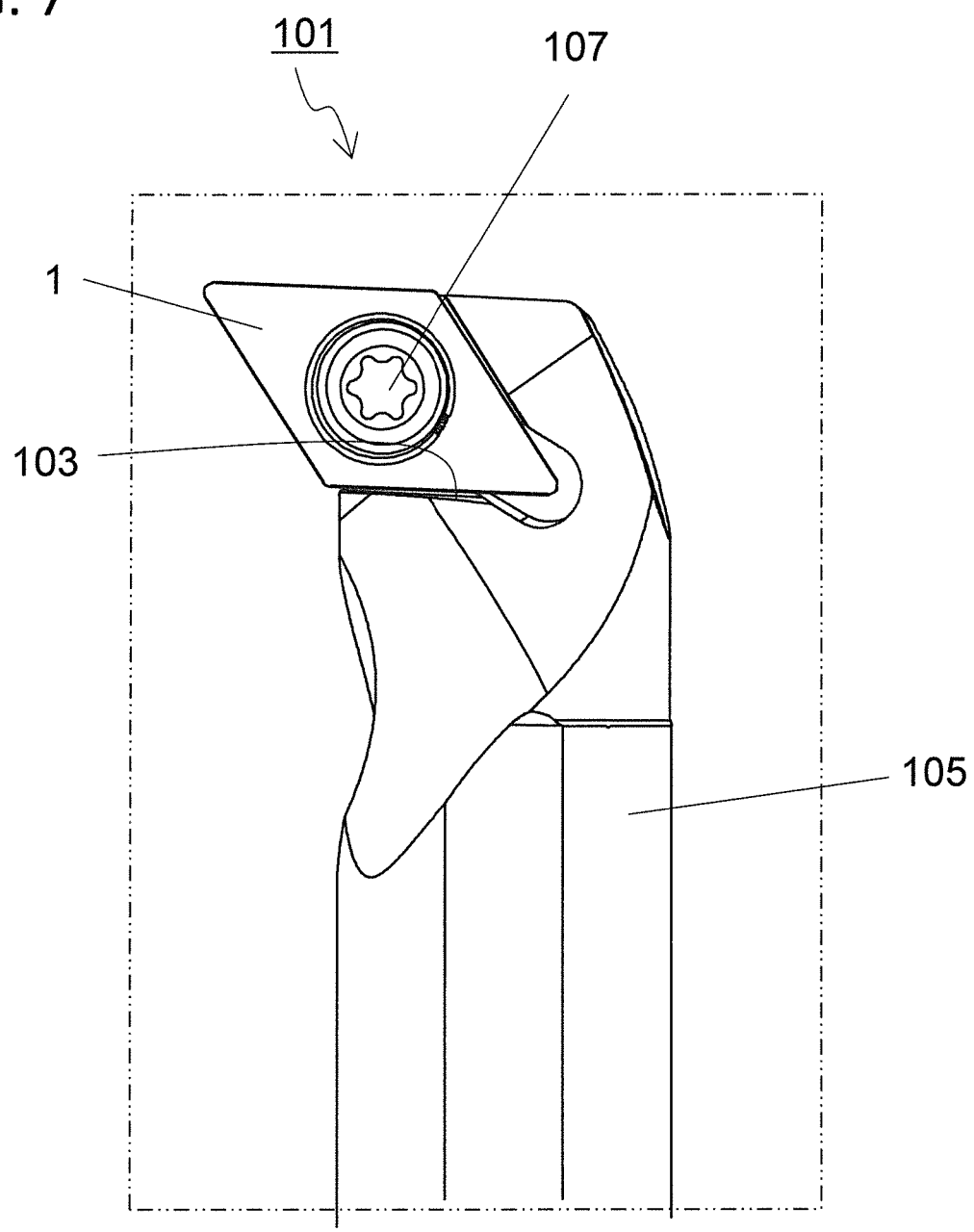
FIG. 7 is an enlarged view of the region B2 illustrated in FIG. 6.

As illustrated in FIGS. 6 and 7, the cutting tool 101 of the present disclosure includes a holder 105 having a bar-shaped body extending from a first end (an upper side in FIG. 6) to a second end (a lower side in FIG. 6) with a pocket 103 located at a side of the first end, and the coated tool 1 located at the pocket 103. In the cutting tool 101 of the present disclosure, the coated tool 1 is attached such that a part of a ridge line used as the cutting edge protrudes from a front end of the holder 105.

The pocket 103 is a part on which the coated tool 1 is attached, and includes a seating surface parallel to a lower surface of the holder 105 and a constraining side surface inclined with respect to the seating surface. In addition, the pocket 103 is open on a side of the first end of the holder 105.

The coated tool 1 is located at the pocket 103. At this time, a lower surface of the coated tool 1 may be in direct contact with the pocket 103, or a sheet may be held between the coated tool 1 and the pocket 103.

The coated tool 1 is attached such that the part of the ridge line used as the cutting edge protrudes outward from the holder 105. The coated tool 1 is attached to the holder 105 by a screw 107. That is, the screw 107 is inserted into the through hole 23 of the coated tool 1, and a front end of the screw 107 is inserted into a screw hole (not illustrated) formed in the pocket 103 to engage screw portions with each other, whereby the coated tool 1 is attached to the holder 105.

As the holder 105, steel, cast iron, or the like can be used. In particular, steel having high toughness among these members may be used.

The examples illustrated in FIGS. 6 and 7 illustrate a cutting tool for use in a so-called turning process. Examples of the turning process include inner diameter processing, outer diameter processing, and a grooving process. Note that the cutting tool is not limited to those used for the turning process. For example, the coated tool 1 of the above non-limiting embodiment may be used as a cutting tool for use in a milling process.

DESCRIPTION OF THE REFERENCE NUMERALS

1: Coated tool
3: Base member
5: Coating layer
7: First surface
9: Second surface
11: Cutting edge
13: First layer
15: Second layer
16: Boundary (boundary between first layer and second layer)
17: Titanium nitride layer
19: Titanium carbonitride layer
19a: First region
19b: Second region
19c: Intermediate region
21: Void
23: Through hole
101: Cutting tool
103: Pocket
105: Holder
107: Fixing screw

What is claimed is:

1. A coated tool, comprising:
a base member comprising a first surface; and a coating layer located on the first surface,
wherein
the base member comprises a hard phase with tungsten carbide particles, and a binder phase comprising cobalt, nickel, or combinations thereof;
island portions each comprising 70 area % or more of the binder phase and having an equivalent circle diameter of 10 μm or more are scattered on the first surface;
the coating layer comprises:
  a first layer comprising a titanium compound and located on the first surface, and
  a second layer comprising aluminum oxide and located on and in contact with the first layer; and
the coating layer comprises a plurality of voids located on the first layer in a cross section orthogonal to the first surface so as to be arranged side by side in a direction along a boundary between the first layer and the second layer; an average value of widths of respective voids of the plurality of voids in the direction along the boundary is less than an average value of distances between the respective voids adjacent to each other; and in the cross section orthogonal to the first surface, an average value of widths of the respective voids in a direction parallel to the first surface is greater than an average value of heights of the respective voids in a direction orthogonal to the first surface.

2. The coated tool according to claim 1, wherein
the first layer further comprises titanium carbonitride, and the second layer further comprises a-alumina.

3. The coated tool according to claim 1, wherein
in the cross section orthogonal to the first surface, an average value of distances from the respective voids to the boundary is greater than an average value of heights of the respective voids in a direction orthogonal to the first surface.

4. The coated tool according to claim 1, wherein
in the cross section orthogonal to the first surface, an average value of distances from the respective voids to the boundary is greater than an average value of distances between the respective voids adjacent to each other in a direction parallel to the first surface.

5. A cutting tool comprising:
a holder comprising a bar shape which extends from a first end to a second end and comprises a pocket located at a side of the first end; and
the coated tool according to claim 1, which is located at the pocket.

6. The coated tool according to claim 3, wherein,
in each void of the plurality of voids, a distance from the void to the boundary is greater than a height of the void in a direction orthogonal to the first surface in the cross section orthogonal to the first surface.

7. The coated tool according to claim 1, wherein
the first layer comprises a plurality of regions, each having a different composition, with the plurality of regions laminated one on another,
the plurality of regions comprises:
  a first region,
  a second region located on the first region, and
  an intermediate region located between the first region and the second region; and
the plurality of voids are located in the intermediate region.

8. The coated tool according to claim 7, wherein
the first region is a moderate temperature TiCN, and the second region is a high temperature TiCN.

9. The coated tool according to claim 1, wherein
in the cross section orthogonal to the first surface, the average value of widths of the voids in a direction parallel to the first surface is w1, and the average value of heights of the voids in a direction orthogonal to the first surface is h1, and
a ratio w1/h1 is greater than 1.2.

* * * * *